(12) United States Patent
Hosoba et al.

(10) Patent No.: US 7,084,433 B2
(45) Date of Patent: Aug. 1, 2006

(54) SEMICONDUCTOR LASER DEVICE CAPABLE OF MAINTAINING THE OPERATION CURRENT LOW AND METHOD OF MANUFACTURING THE SAME

(75) Inventors: Hiroyuki Hosoba, Kyoto-fu (JP); Atsuo Tsunoda, Kashiba (JP); Hiroshi Hayashi, Kyoto-fu (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 10/377,704

(22) Filed: Mar. 4, 2003

(65) Prior Publication Data

US 2003/0169793 A1    Sep. 11, 2003

(30) Foreign Application Priority Data

Mar. 8, 2002    (JP) .............................. 2002-063322

(51) Int. Cl.
    *H01L 33/00*    (2006.01)
(52) U.S. Cl. ........................... 257/97; 257/95; 257/96; 438/22; 438/32; 438/39; 372/46; 372/47
(58) Field of Classification Search ................... 372/46, 372/43, 40, 44
    See application file for complete search history.

(56) References Cited

U.S. PATENT DOCUMENTS

| 5,065,402 | A | * | 11/1991 | Kawano ....................... 372/46 |
| 5,272,109 | A | * | 12/1993 | Motoda ........................ 438/40 |
| 5,528,617 | A | | 6/1996 | Kobayashi et al. |
| 5,610,096 | A | * | 3/1997 | Yodoshi et al. ................ 438/40 |
| 5,789,773 | A | | 8/1998 | Takeoka et al. |
| 6,009,112 | A | * | 12/1999 | Uchida ......................... 372/46 |
| 6,266,354 | B1 | * | 7/2001 | Chino et al. ................... 372/43 |
| 6,614,821 | B1 | * | 9/2003 | Jikutani et al. ................ 372/43 |
| 6,631,148 | B1 | * | 10/2003 | Fukuhisa et al. .............. 372/43 |
| 2001/0050531 | A1 | * | 12/2001 | Ikeda .......................... 313/498 |
| 2003/0146444 | A1 | * | 8/2003 | Onishi ......................... 257/85 |

FOREIGN PATENT DOCUMENTS

| JP | 63-314882 | | 12/1988 |
| JP | 05-007049 | | 1/1993 |
| JP | 07-249838 | | 9/1995 |
| JP | 09-097948 | | 4/1997 |
| JP | 09-237935 | | 9/1997 |
| JP | 200058982 | * | 2/2000 |

* cited by examiner

*Primary Examiner*—Nathan J. Flynn
*Assistant Examiner*—Fazli Erdem
(74) *Attorney, Agent, or Firm*—Morrison & Foerster LLP (57) ABSTRACT

In this semiconductor laser device, an InGaP etching block layer 11 as an etching selection layer having etching selectivity for an n-type AlInP current block layer 10, which is a non-optical-absorption layer, is formed on the n-type current block layer 10. Since this etching block layer 11 prevents the current block layer 10 on both sides of a ridge 20 from being etched during manufacture, a contact layer 12 can be prevented from entering gaps between the sides of this ridge 20 and the current block layer 10. Therefore, light oscillating in an active layer 4 is taken out from a device end surface without being absorbed in the contact layer 12. According to this semiconductor laser device, an oscillation threshold current and an operation current can be maintained low, deterioration of differential quantum efficiency can be prevented and reliability can be improved.

7 Claims, 7 Drawing Sheets

SEMICONDUCTOR LASER DEVICE CAPABLE OF MAINTAINING THE OPERATION CURRENT LOW AND METHOD OF MANUFACTURING THE SAME

BACKGROUND OF THE INVENTION

The present invention relates to a III-V Group compound semiconductor laser device, and a method of manufacturing the same.

A semiconductor laser device using an AlGaInP semiconductor material is being developed as a light-emitting device in a visible region since it can be lattice-matched to a GaAs substrate and has the largest direct transition bandgap among III-V Group compound semiconductors. This semiconductor laser device is used as a light-emitting device in the visible region since data can be recorded in higher density particularly when used as a light source for an optical disc or audio/video disc.

Since high reliability is now required in high output operations, many structures that realize such a characteristic are being proposed.

A method of manufacturing a conventional semiconductor laser is described below with reference to cross sectional views in FIGS. 6A–6C and FIGS. 7A–7C.

Figure 6A:
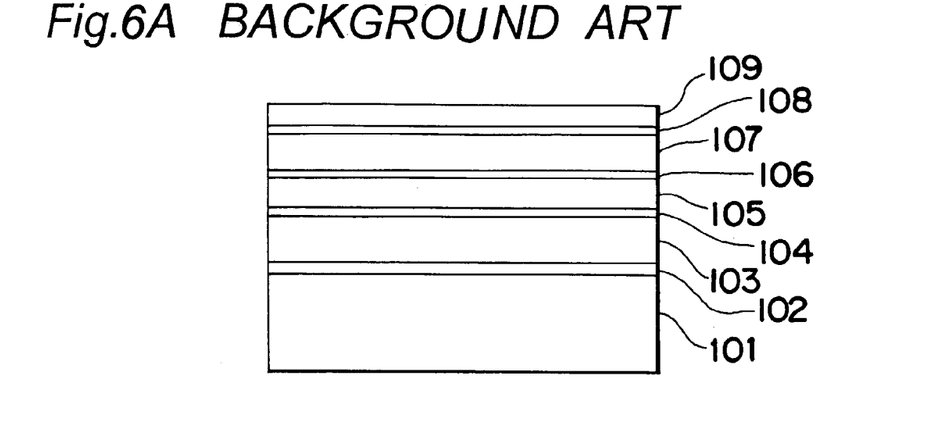
FIGS. 6A to 6C are cross sectional views successively showing steps of manufacturing a conventional semiconductor light-emitting device.

As shown in FIG. 6A, first, an n-type GaAs buffer layer 102, n-type AlGaInP clad layer 103, GaInP active layer 104, first p-type AlGaInP clad layer 105, GaInP etching stop layer 106, second p-type AlGaInP clad layer 107, p-type GaInP intermediate layer 108 and p-type GaAs contact layer 109 are laminated on an n-type GaAs substrate 101 in a first growth step.

Figure 6B:
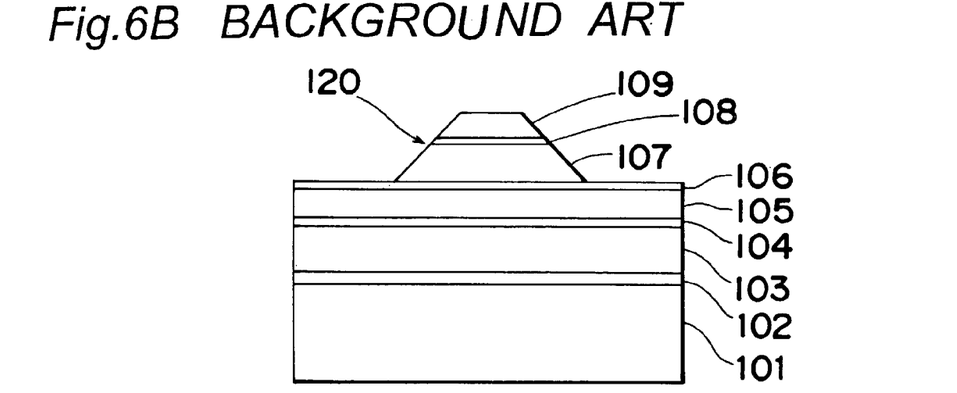

Subsequently, as shown in FIG. 6B, three layers of the second p-type AlGaInP clad layer 107, p-type GaInP intermediate layer 108 and p-type GaAs contact layer 109 are etched so that etching is stopped at the GaInP etching stop layer 106 to form a ridge 120.

Figure 6C:
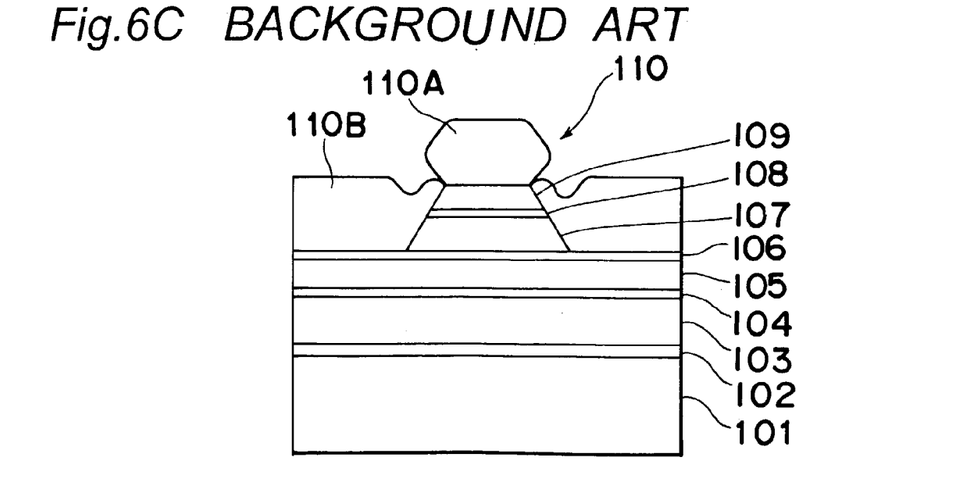

Subsequently, as shown in FIG. 6C, an n-type AlInP current block layer 110 is laminated in a second growth step. This current block layer 110 is constituted by a summit portion 110A laminated on the ridge 120 and side portions 110B formed on both sides of the ridge 120 on the etching stop layer 106.

Figure 7A:
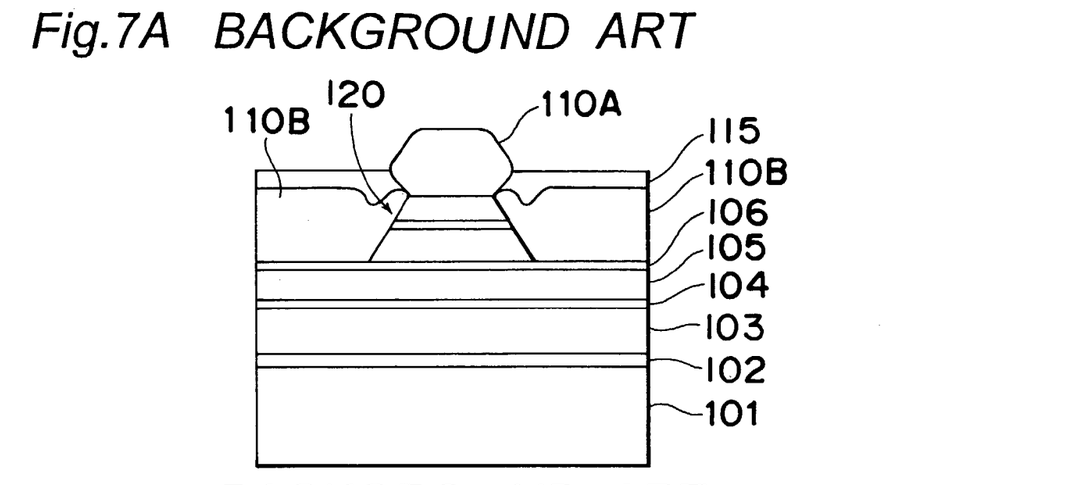
FIGS. 7A to 7C are cross sectional views successively showing steps following FIG. 6 in the above conventional example.

Subsequently, as shown in FIG. 7A, a resist 115 is applied on both sides of the summit portion 110A of the n-type AlInP current block layer 110 laminated on the aforementioned ridge 120, and the summit portion 110A of the n-type AlInP current block layer 110 on the ridge 120 is etched by a lithography technique to remove the summit portion 110A.

Meanwhile, upon this etching, the summit portion 110A of the n-type AlInP current block layer 110 laminated on the ridge 120 and the side portions 110B of the n-type AlInP current block layer 110 deposited on both sides of the ridge 120 are brought into contact with one another as shown in FIG. 7A. Alternatively, there is a narrow gap between the summit portion 110A and the side portions 110B.

Figure 7B:
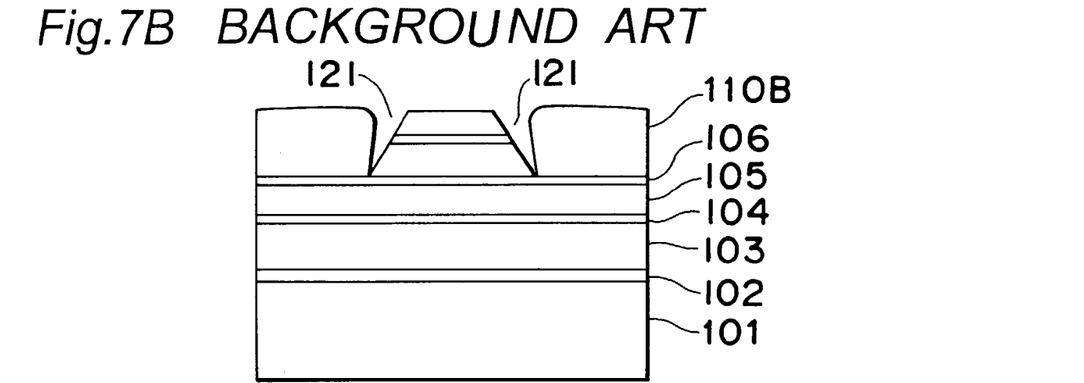
Figure 7C:
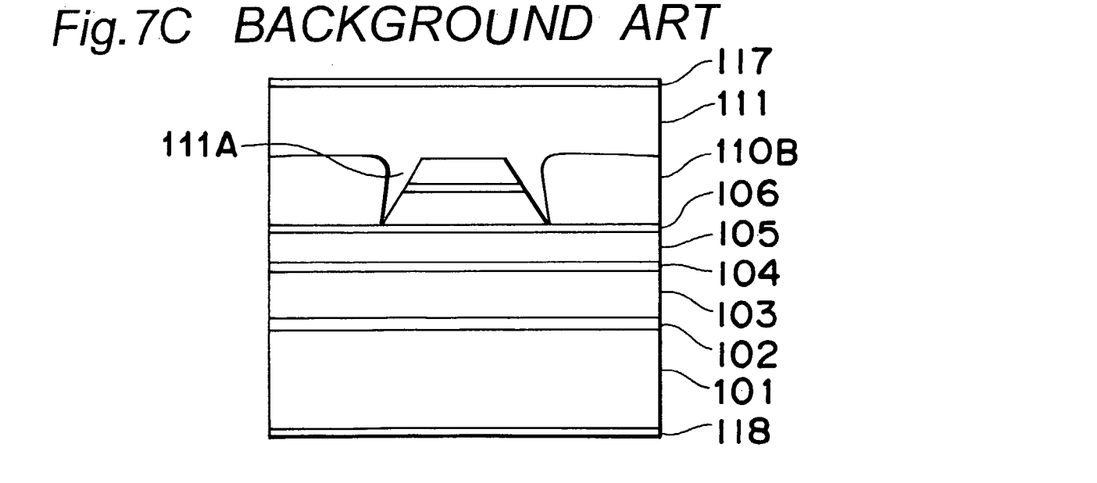

Therefore, upon the etching, the side portions 110B of the n-type AlInP current block layer 110 deposited on both sides of the ridge 120 are also etched, and hence wedge-shaped gaps 121 are formed between the side portions 110B and the ridge 120 as shown in FIG. 7B. Then, a p-type GaAs contact layer 111 is grown in a third growth as shown in FIG. 7C, and a p-type electrode 117 and an n-type electrode 118 are formed.

In the above conventional example, as shown in FIG. 7B, the side portions 110B of the n-type AlInP current block layer 110 positioned on both sides of the ridge 120 are etched. Therefore, wedge-shaped gaps 121 are formed between the ridge 120 and the side portions 110B, and a structure in which wedge portions 111A of the p-type GaAs contact layer 111 enter these gaps 121 is obtained as shown in FIG. 7C.

Since this p-type GaAs contact layer 111 has a smaller bandgap than that of the GaInP active layer 104, light oscillating in the GaInP active layer 104 is absorbed in the wedge portions 111A of the p-type GaAs contact layer 111 existing on the sides of the ridge 120. Therefore, an oscillation threshold current or an operation current increases, and differential quantum efficiency declines, thereby resulting in deterioration of laser characteristics such as lower reliability.

SUMMARY OF THE INVENTION

Accordingly, an object of the present invention is to provide a semiconductor laser device with which an oscillation threshold current or an operation current can be maintained low, deterioration of differential quantum efficiency can be prevented, and thereby reliability can be improved, and a method of manufacturing the same.

In order to achieve the above object, there is provided a semiconductor laser device in which a ridge including a clad layer is formed on an active layer, wherein a non-optical-absorption layer without light absorption is formed on both sides of the ridge, and an etching selection layer having etching selectivity for a predetermined etchant of being less easily etched in comparison with the non-optical-absorption layer is formed on the non-optical-absorption layer.

In the present invention, an etching selection layer having etching selectivity of being less easily etched in comparison with the non-optical-absorption layer is formed on the non-optical-absorption layer. Since this etching selection layer prevents the non-optical-absorption layer on both sides of the ridge from being etched during manufacture, a contact layer formed on the ridge can be prevented from entering gaps between the sides of this ridge and the non-optical-absorption layer. Therefore, light oscillating in the active layer is not absorbed in the contact-layer, and taken out from a device end surface. Therefore, an increase of an oscillation threshold current or an operation current and deterioration of differential quantum efficiency observed in a conventional example do not occur, and thereby favorable reliability can be obtained.

In one embodiment of the present invention, the non-optical-absorption layer is formed with $Al_xGa_yIn_{1-x-y}P$ ($0<X\leq 1$, $0\leq Y\leq 1$).

In this embodiment, the non-optical-absorption layer is formed with $Al_xGa_yIn_{1-x-y}P$ ($0<X\leq 1$, $0\leq Y\leq 1$). Therefore, this non-optical-absorption layer can have etching selectivity for an etching selection layer made of InGaP, for example.

In one embodiment of the present invention, the etching selection layer is formed with $Al_xGa_yIn_{1-x-y}P$ ($0\leq X\leq 1$, $0<Y\leq 1$).

In the semiconductor laser device of this embodiment, the etching selection layer is formed with $Al_xGa_yIn_{1-x-y}P$ ($0\leq X\leq 1$, $0<Y\leq 1$). Therefore, this etching selection layer can have etching selectivity for a non-optical-absorption layer made of n-type. AlInP, for example.

In one embodiment of the present invention, the etching selection layer is formed with $Al_xGa_{1-x}As$ ($0\leq X\leq 1$).

In this embodiment, the etching selection layer is formed with $Al_xGa_{1-x}As$ ($0\leq X\leq 1$). Therefore, this etching selection layer can have etching selectivity for a non-optical-absorption layer made of n-type AlInP, for example.

In one embodiment of the present invention, the etching selection layer is formed with $Al_XGa_YIn_{1-X-Y}As_ZP_{1-Z}$ ($0 \leq X \leq 1$, $0 < Y \leq 1$, $0 \leq Z \leq 1$).

In this embodiment, the etching selection layer is formed with $Al_XGa_YIn_{1-X-Y}As_ZP_{1-Z}$($0 \leq X \leq 1$, $0 < Y \leq 1$, $0 \leq Z \leq 1$). Therefore, this etching selection layer can have etching selectivity for a non-optical-absorption layer made of n-type AlInP, for example.

In one embodiment of the present invention, a thickness of the etching selection layer is made 50 Å or greater.

In this embodiment, since the etching selection layer has a thickness of 50 Å or greater, etching selectivity for the non-optical-absorption layer can be further improved. When the etching selection layer has a thickness of less than 50 Å, etching selectivity for the non-optical-absorption layer may not be secured sufficiently.

Also, there is provided a method of manufacturing a semiconductor laser device having a structure in which a ridge including a clad layer is formed on an active layer, and a non-optical-absorption layer without light absorption is formed on both sides of this ridge, which comprises steps of:

forming the ridge, and epitaxially growing successively at least the non-optical-absorption layer and an etching selection layer having etching selectivity for a predetermined etchant of being less easily etched in comparison with the non-optical-absorption layer, and etching a portion on an upper end surface of the ridge of the non-optical-absorption layer by using the predetermined etchant, while not etching a portion grown on a side surface of the ridge of the non-optical-absorption layer.

In the method of manufacturing a semiconductor laser device of this invention, after the ridge is formed, the non-optical-absorption layer and the etching selection layer are successively grown, and a portion on the upper end surface of the ridge of the non-optical-absorption layer is etched while a portion grown on the sides of the ridge of the non-optical-absorption layer is not etched.

Therefore, according to the manufacturing method of this invention, since a contact layer does not enter on the ridge sides, light oscillating in an active layer is not absorbed in the contact layer. Therefore, a semiconductor laser with which an increase of an oscillation threshold current or an operation current observed in a conventional example does not occur, differential quantum efficiency is not deteriorated, and thereby favorable reliability can be obtained can be manufactured.

In one embodiment of the present invention, the predetermined etchant contains phosphoric acid.

In the method of manufacturing a semiconductor laser device of this embodiment, since the predetermined etchant contains phosphoric acid, the semiconductor laser can be manufactured even with a better yield.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention are described in detail with reference to the accompanying drawings.

First Embodiment

Steps of manufacturing an AlGaInP semiconductor laser device according to a first embodiment of the invention are shown in cross sectional views in FIGS. 1 to 4.

Figure 1A:
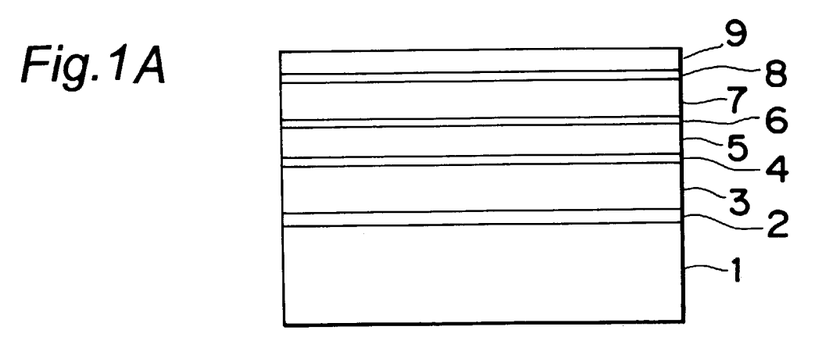
FIGS. 1A to 1C are cross sectional views successively showing steps of manufacturing a semiconductor light-emitting device according to a first embodiment of the invention.

First, as shown in FIG. 1A, as a first growth step, an n-type GaAs buffer layer 2, n-type AlGaInP clad layer 3, GaInP active layer 4, first p-type AlGaInP clad layer 5, GaInP etching stop layer 6, second p-type AlGaInP clad layer 7, p-type GaInP intermediate layer 8, and p-type GaAs cap layer 9 are laminated on an n-type GaAs substrate 1 by an MBE (Molecular Beam Epitaxial) method.

Figure 1B:
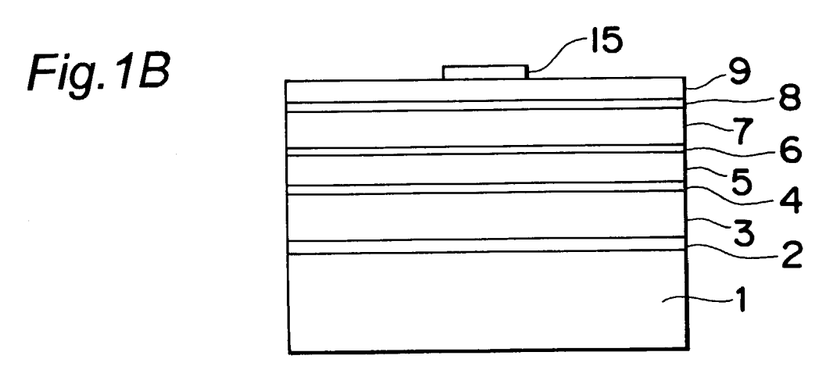
Figure 1C:
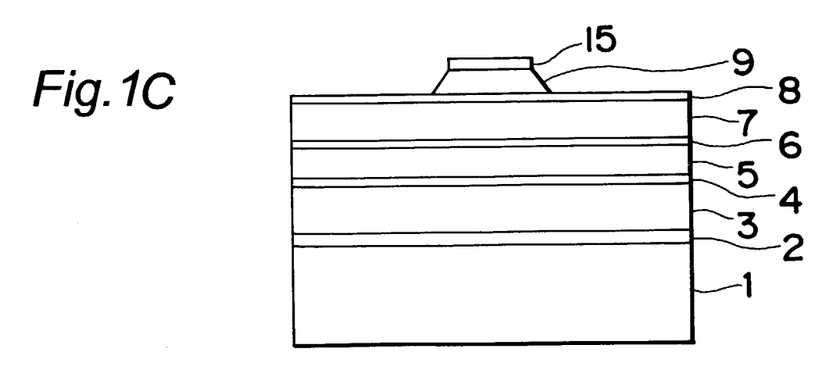

Subsequently, as shown in FIG. 1B, a resist 15 is applied on the cap layer 9 and formed into a stripe. Then, as shown in FIG. 1C, the p-type GaAs cap layer 9 is etched with a sulfuric acid etchant.

Figure 2A:
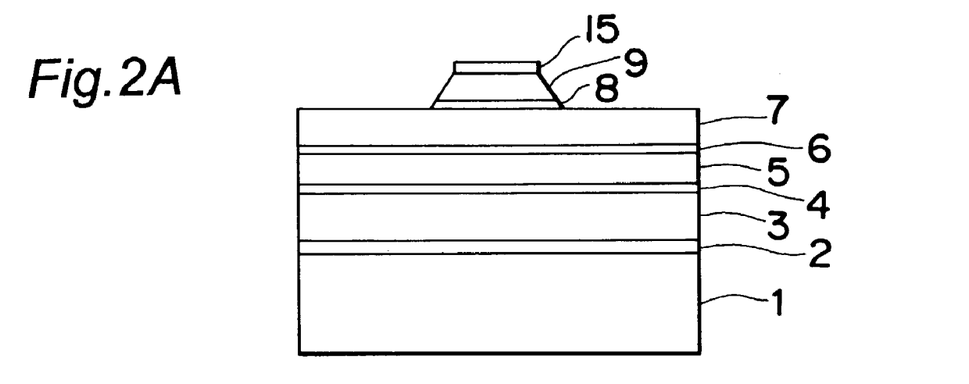
FIGS. 2A to 2C are cross sectional views successively showing steps following FIG. 1 in the above embodiment.
Figure 2B:
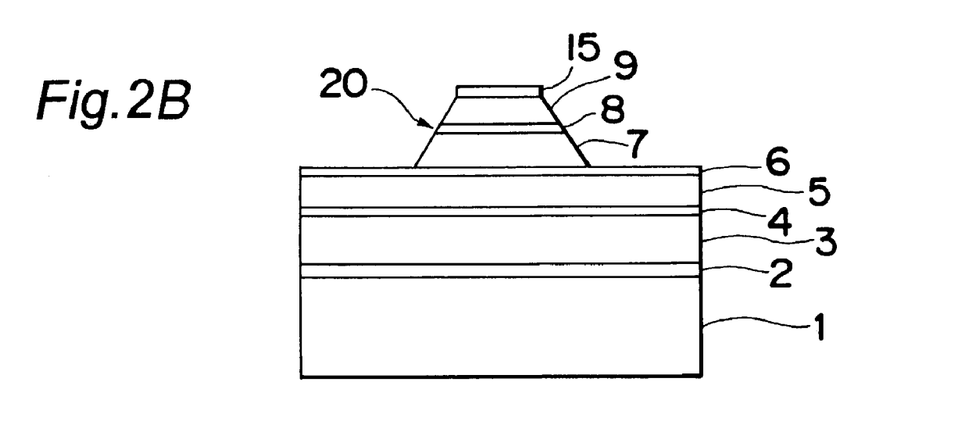

Subsequently, as shown in FIG. 2A, the p-type GaInP intermediate layer, 8 is etched with a bromine etchant. Then, as shown in FIG. 2B, the second p-type AlGaInP clad layer 7 is etched with a phosphoric acid etchant up to the GaInP etching stop layer 6. Consequently, a ridge 20 is formed.

Figure 2C:
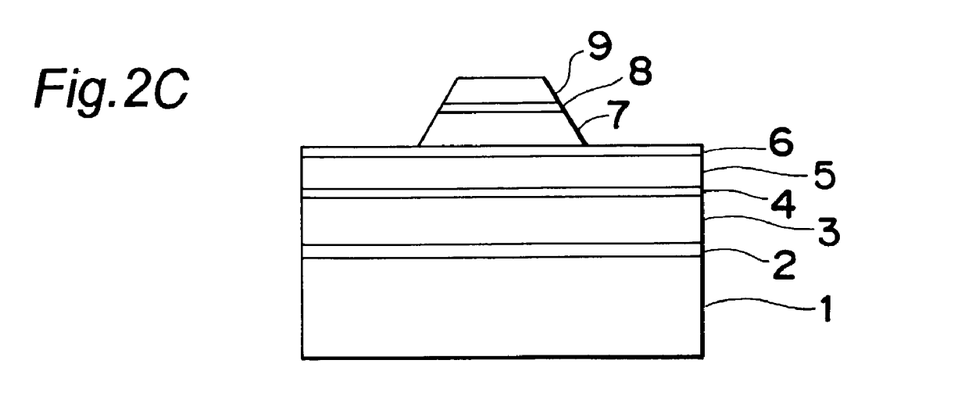
Figure 3A:
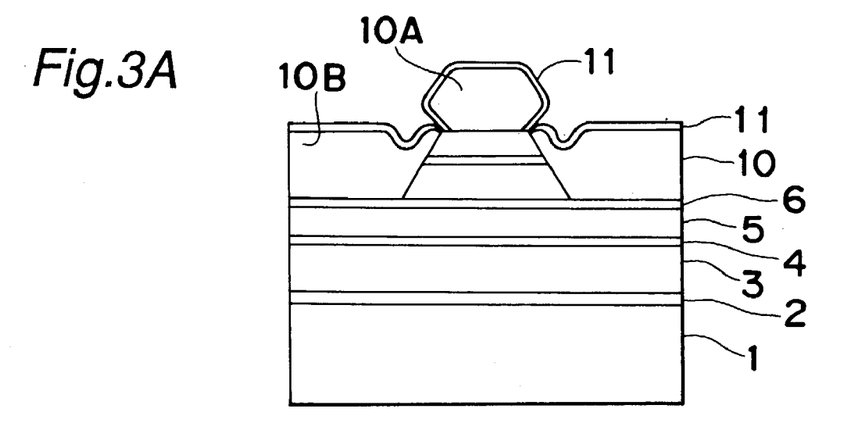
FIGS. 3A to 3C are cross sectional views successively showing steps following FIG. 2 in the above embodiment.

Subsequently, as shown in FIG. 2C, the resist 15 is removed, and then, as shown in FIG. 3A, an n-type AlInP current block layer 10 as a non-optical-absorption layer and an InGaP etching block layer 11 as an etching selection layer are laminated by a molecular beam epitaxial method as a second growth step.

As shown in FIG. 3A, the current block layer 10 is constituted by side portions 10B laminated on sides of the ridge 20 on the etching stop layer 6 and a summit portion 10A laminated on the ridge 20.

Figure 3B:
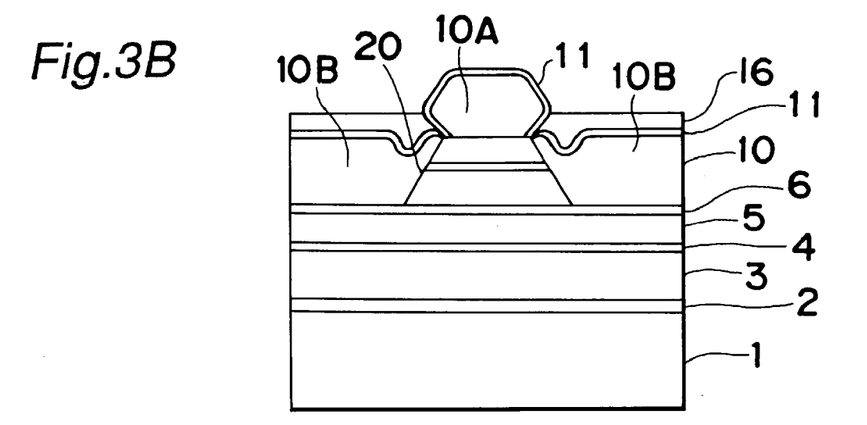
Figure 3C:
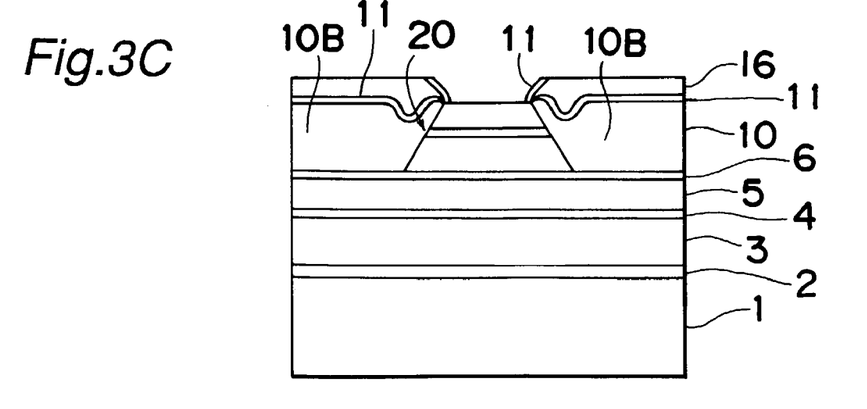

Subsequently, as shown in FIG. 3B, a resist 16 is applied on both sides of the summit portion 10A and formed into a stripe. As shown in FIG. 3C, the summit portion 10A of the n-type AlInP current block layer 10 deposited on the ridge 20 is etched with a phosphoric acid etchant. At this time, a gap is narrow between the summit portion 10A of the n-type AlInP current block layer 10 deposited on the ridge 20 and the current block layer side portions 10B on the sides of the ridge 20.

However, since surfaces of the summit portion 10A and the side portions 10B are covered with the InGaP etching block layer 11 as an etching selection layer, the side portions 10B of the n-type AlInP current block layer on the sides of the ridge 20 are not etched.

Figure 4A:
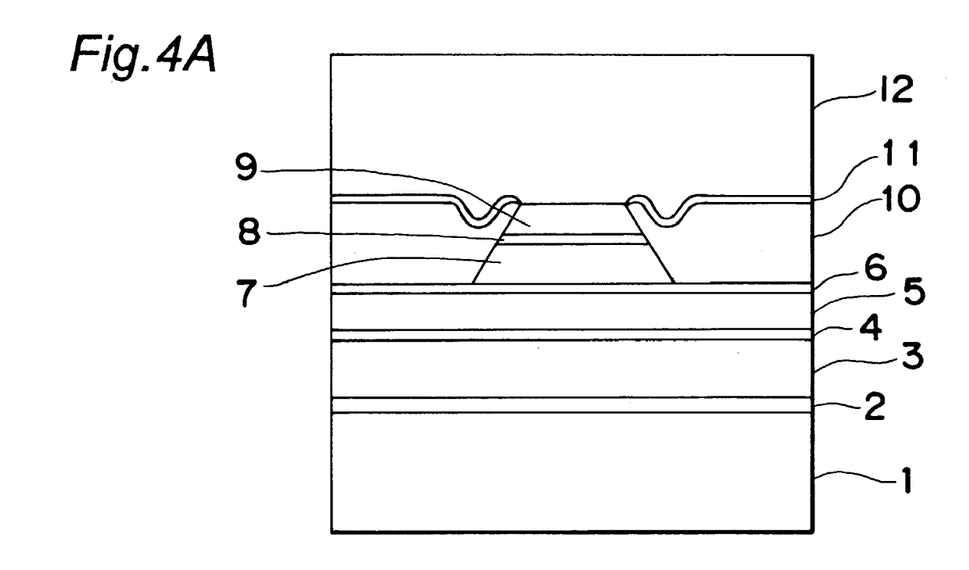
FIGS. 4A and 4B are cross sectional views successively showing steps following FIG. 3 in the above embodiment.
Figure 4B:
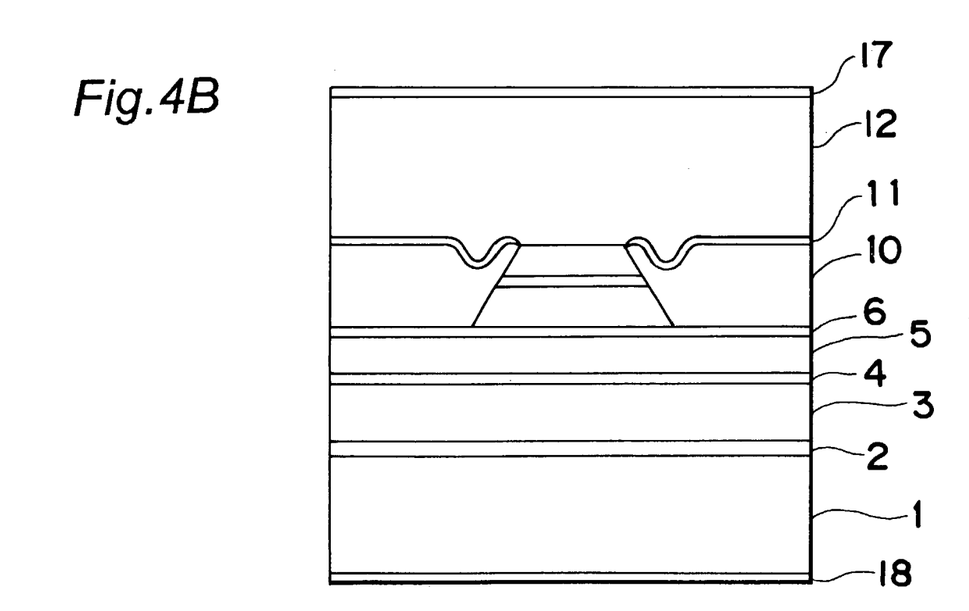

Subsequently, as shown in FIG. 4A, the resist 16 is removed, a p-type GaAs contact layer 12 is deposited as a third growth step, and an n-type electrode 18 and a p-type electrode 17 are formed as shown in FIG. 4B.

In this embodiment, as shown in FIG. 3B, the InGaP etching block layer 11 is laminated between the summit portion 10A deposited on the ridge 20 and the side portions 10B on the sides of the ridge 20. Therefore, when the summit portion 10A of the n-type AlInP current block layer 10 is etched with a phosphoric acid etchant, the n-type AlInP current block layer 10B on the sides of the ridge 20 are not etched. Therefore, the p-type GaAs contact layer 12 does not enter on the sides of the ridge 20. Therefore, light oscillating in the GaInP active layer 4 is not absorbed in the contact layer 12 and can be taken out from a device end surface.

Thus, in this embodiment, an increase of an oscillation threshold current or an operation current observed in a conventional example can be avoided, differential quantum efficiency is not deteriorated, and thereby favorable reliability can be obtained.

In this embodiment, InGaP is used for the etching block layer 11 as an etching selection layer, but this etching block layer may be formed with $Al_XGa_YIn_{1-X-Y}P$ ($0 \leq X \leq 1$, $0 < Y \leq 1$). Furthermore, n-type AlInP is used for the current block layer 10 as a non-optical-absorption layer, but this current block layer 10 may be formed with $Al_XGa_YIn_{1-X-Y}P$ ($0 < X \leq 1$, $0 \leq Y \leq 1$). Furthermore, an AlGaInP layer is used as the second clad layer 7, but effects of the present invention do not change even when composition ratios are changed. Furthermore, when a thickness of the etching block layer 11 is made 50 Å or greater, etching selectivity for the current block layer 10 as a non-optical-absorption layer can be further improved. Furthermore, the present invention can also be applied when the GaInP active layer has a quantum well structure.

Second Embodiment

Figure 5:
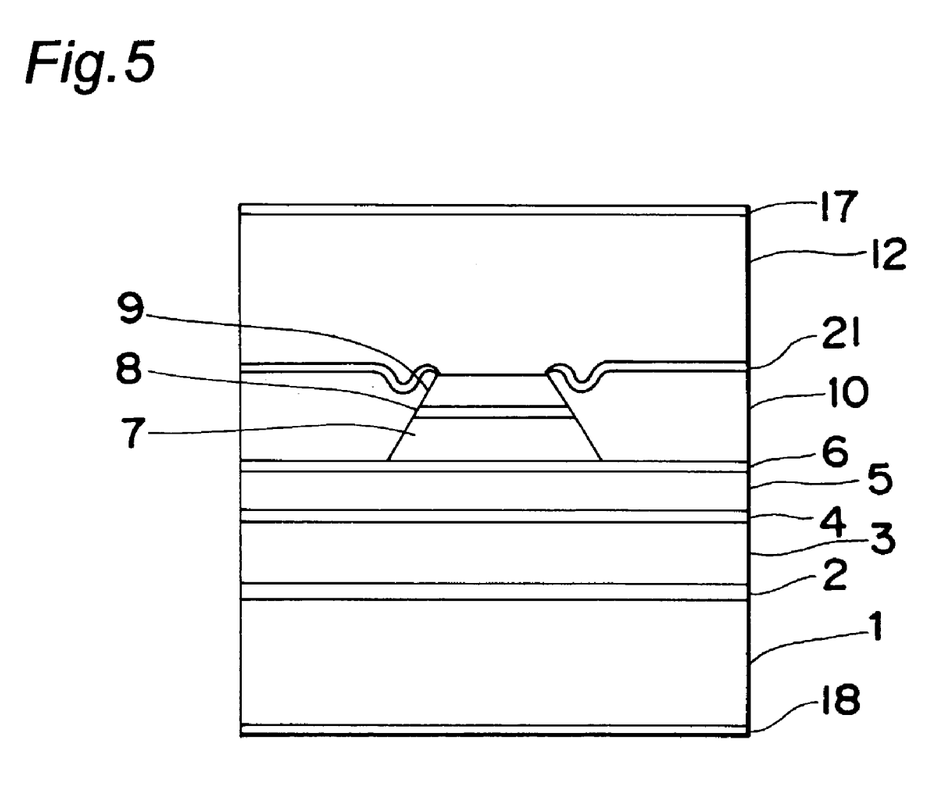
FIG. 5 is a cross sectional view showing a semiconductor light-emitting device according to a second embodiment of the invention.

FIG. 5 shows a cross section of an AlGaInP compound semiconductor light-emitting device according to a second embodiment of the invention. The semiconductor light-emitting device of the second embodiment is specifically a semiconductor laser device.

The second embodiment is different from the AlGaInP semiconductor laser device manufactured in the above first embodiment only in that an etching block layer 21 as an etching selection layer is made of GaAs. The other. structure components are the same as those of the semiconductor laser device manufactured in the first embodiment.

According to the semiconductor laser device of the second embodiment, since the etching block layer 21 is made of GaAs, the semiconductor laser device has more selectivity for a phosphoric acid etchant in comparison with the semiconductor laser device manufactured in the first embodiment, in which the etching block layer 11 is made of InGaP.

Therefore, when the summit portion 10A of the n-type AlInP current block layer 10 is etched with a phosphoric acid etchant, an effect of preventing the n-type AlInP current block layer 10B on the sides of the ridge 20 from etching can be increased in comparison with the first embodiment. Accordingly, the semiconductor laser can be readily manufactured even with a better yield.

Furthermore, the etching block layer 21 is formed with GaAs in the second embodiment, but this etching block layer may be formed with $Al_XGa_{1-X}As$ ($0 \leq X \leq 1$). Furthermore, this etching block layer may be formed with $Al_XGa_YIn_{1-X-Y}As_ZP_{1-Z}$ ($0 \leq X \leq 1$, $0 < Y \leq 1$, $0 \leq Z \leq 1$).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device in which a ridge including a clad layer is formed on an active layer, wherein
    a non-optical-absorption layer without light absorption is formed with $Al_XGa_YIn_{1-X-Y}P$ ($0 < X \leq 1$, $0 \leq Y \leq 1$) on both sides of the ridge, and
    an etching selection layer having etching selectivity for a predetermined etchant of being less easily etched in comparison with the non-optical-absorption layer is formed on the non-optical- absorption layer.

2. The semiconductor laser device according to claim 1, wherein
    the etching selection layer is formed with $Al_XGa_YIn_{1-X-Y}P$ ($0 \leq X \leq 1$, $0 < Y \leq 1$) .

3. The semiconductor laser device according to claim 1, wherein
    the etching selection layer is formed with $Al_XGa_{1-X}As$ ($0 \leq X \leq 1$).

4. The semiconductor laser device according to claim 1, wherein the etching selection layer is formed with $Al_XGa_YIn_{1-X-Y}As_ZP_{1-Z}$ ($0 \leq X \leq 1$, $0 < Y \leq 1$, $0 \leq Z \leq 1$).

5. The semiconductor laser device according to claim 1, wherein
    a thickness of the etching selection layer is made 50 Å or greater.

6. A method of manufacturing a semiconductor laser device having a structure in which a ridge including a clad layer is formed on an active layer, and a non-optical-absorption layer without light absorption is formed on both sides of this ridge, which comprises steps of:
    forming the ridge, and epitaxially growing successively at least the non-optical-absorption layer and an etching selection layer having etching selectivity for a predetermined etchant of being less easily etched in comparison with the non-optical-absorption layer, and
    etching a portion on an upper end surface of the ridge of the non-optical-absorption layer by using the predetermined etchant, while not etching a portion grown on a side surface of the ridge of the non-optical-absorption layer.

7. The method of manufacturing a semiconductor laser device according to claim 6, wherein the predetermined etchant contains phosphoric acid.

* * * * *